United States Patent [19]

Okuyama et al.

[11] Patent Number: 5,234,842

[45] Date of Patent: Aug. 10, 1993

[54] METHOD OF PRODUCING P-TYPED CDS

[75] Inventors: Hiroyuki Okuyama; Katsuhiro Akimoto; Masao Ikeda, all of Kanagawa, Japan

[73] Assignee: Sony Corporation, Tokyo, Japan

[21] Appl. No.: 848,128

[22] Filed: Mar. 9, 1992

[30] Foreign Application Priority Data

Mar. 8, 1991 [JP] Japan .................. 3-043502

[51] Int. Cl.$^5$ ......................... H01L 21/265
[52] U.S. Cl. ......................... 437/22; 437/23; 437/905; 257/13; 257/56
[58] Field of Search ............ 437/22, 165, 23, 905; 257/56, 13

[56] References Cited

U.S. PATENT DOCUMENTS

| | | | |
|---|---|---|---|
| 4,863,821 | 9/1989 | Iino et al. | 430/84 |
| 4,885,226 | 12/1989 | Takechi et al. | 430/84 |
| 4,989,025 | 8/1990 | Yamamoto et al. | 257/56 |

Primary Examiner—Brian E. Hearn
Assistant Examiner—Kevin M. Picardat
Attorney, Agent, or Firm—Hill, Steadman & Simpson

[57] ABSTRACT

A method of producing a p-type CdS wherein oxygen is doped into a CdS layer at a concentration in a range between $10^{16}$ and $10^{19}$ atomic/cm$^3$.

7 Claims, 3 Drawing Sheets

METHOD OF PRODUCING P-TYPED CDS

BACKGROUND OF THE INVENTION

1. Field of the Invention

The present invention generally relates to methods of producing p-type CdSs and, more particularly, is directed to a method of producing a p-type CdS suitable for use in a light-emitting element such as a photoluminescence element, a laser diode or the like.

2. Description of the Prior Art

Recently, short-wavelength light sources have been demanded, for example, in optical recording and/or reproducing techniques due to the requirement for high-density recording and high-resolution.

In a CdS mixed crystal or CdS crystal in an intermixing state or disordered state which is a II-VI compound semiconductor, it is difficult to produce a p-type CdS mixed crystal.

According to the general semiconductor theory, acceptor and donor impurities to be doped in the II-VI mixed crystal are selected from I and VII elements, respectively. However, in the CdS mixed crystal, since the steam pressure of the element S is high, in the process of forming a p-type impurity doped CdS, the element S is likely released from the CdS to leave vacancies. Thus, the degree of crystallization of the CdS alloy becomes low.

Further, there has not been realized a p-type CdS whose acceptor level is low. This is because, even in the lower acceptor level elements utilized as impurities, for example, Li, Na and P, the acceptor levels thereof are 165 meV, 169 meV and 120 meV, respectively.

FIG. 1 shows an emission spectral distribution of a conventional CdS in which Na and Cl are doped as impurities. As clear from FIG. 1, the wavelengths of emission light of this CdS are not sufficiently short.

Accordingly, there has not been realized an acceptor-donor pair type light emitting element which utilizes the CdS mixed crystal and can emit light of short wavelengths.

OBJECTS AND SUMMARY OF THE INVENTION

It is an object of the present invention to provide an improved method of producing a p-type CdS in which the aforementioned shortcomings and disadvantages encountered with the prior art can be eliminated.

More specifically, it is an object of the present invention to provide a method of producing a p-type CdS having a low impurity energy level which therefore can provide a p-type CdS high in an activation ratio and excellent in the crystallization degree, that is, a light emitting element having a high luminance efficacy in the short wavelengths.

As an aspect of the present invention, there is provided a method of producing a p-type CdS which is comprised of the step of doping oxygen into a CdS at a concentration between $10^{16}$ and $10^{19}$ atomic/cm$^3$.

The reason why the oxygen concentration in the CdS is set to be in a range between $10^{16}$ and $10^{19}$ atomic/cm$^3$ is that the inventors of the present invention have found that the CdS is not made as a p-type one sufficiently when the concentration is less than $10^{16}$ atomic/cm$^3$, while that there occurs problem in the crystallization thereof when the concentration exceeds $10^{19}$ atomic/cm$^3$.

Thus, when oxygen is doped in the p-type CdS at the above-described concentration range, it is possible to provide a p-type CdS which can suppress the generation of the vacancy and is good in the crystallization and made as a p-type one.

Further, since the oxygen-doped CdS is low in the acceptor level and so high in the activation ratio, when a light-emitting element is constituted by using this CdS, it is possible to perform acceptor-donor pair light emission at a short wavelength of 5070 A and high energy light emission with a high luminance efficacy.

The preceding and other objects, features, and advantages of the present invention will become apparent from the following detailed description of an illustrative embodiment thereof when read in conjunction with the accompanying drawings.

DESCRIPTION OF THE PREFERRED EMBODIMENT

An embodiment of a method of producing a p-type CdS according to the present invention will now be described with reference to FIGS. 2 to 4.

Figure 2:
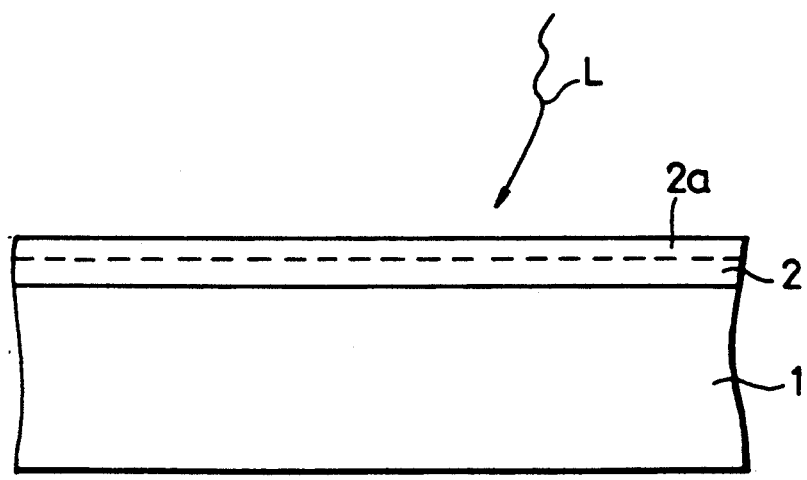
FIG. 2 shows a cross section of a photoluminescence element utilizing a p-type CdS produced according to an embodiment of a method of the present invention.

FIG. 2 shows a cross section of a photoluminescence element utilizing a p-type CdS produced by the embodiment of the method according to the present invention.

The p-type CdS of this embodiment is produced in the following manner.

Firstly, on a GaAs monocrystalline substrate 1, a CdS layer 2 is formed, for example, to 2 μm in thickness by the epitaxial growth method of the well known technique, e.g., the molecular beam epitaxy (MBE) technique or the like.

Then, oxygen is doped into the CdS layer 2 from its free surface, for example, to 1.2 μm in thickness by the ion implantation technique to thereby form an oxygen doped layer 2a. In this case, oxygen is doped into the CdS layer at a concentration between $10^{16}$ and $10^{19}$ atomic/cm$^3$, preferably. Thereafter, the oxygen doped layer 2a is subjected to the annealing-process at a temperature of 419° C. to thereby produce a p-type.

Figure 3:
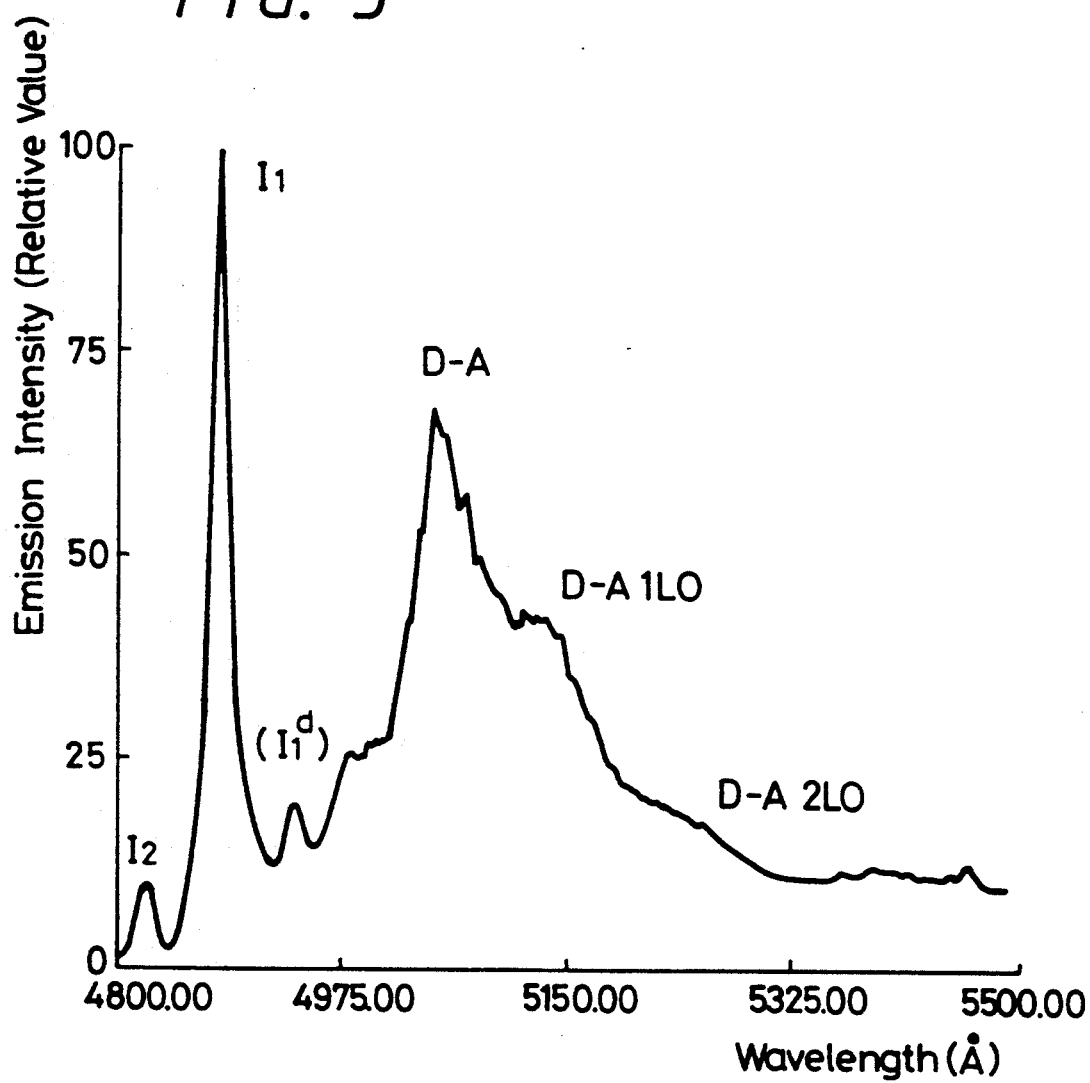
FIG. 3 shows an DA emission spectral distribution of the p-type CdS produced by the present invention.

FIG. 3 shows a light emission spectral distribution of the thus formed p-type CdS at 4° K. when an excitation light L is radiated thereon from the CdS layer 2 side. As clear from FIG. 3, there are peak points $I_2$ and $I_1$ respectively due to donor and acceptor bound excitons, and further there are donor-acceptor pair (D-A) light emissions.

These emissions can be understood to be the D-A light emissions from FIG. 3 since there are the emissions due to phonon replica, that is, emission $D-A_{1l0}$ due to the excitation of one Lo phonon and emission $D-A_{2l0}$ due to the excitation of two Lo phonons.

Figure 4:
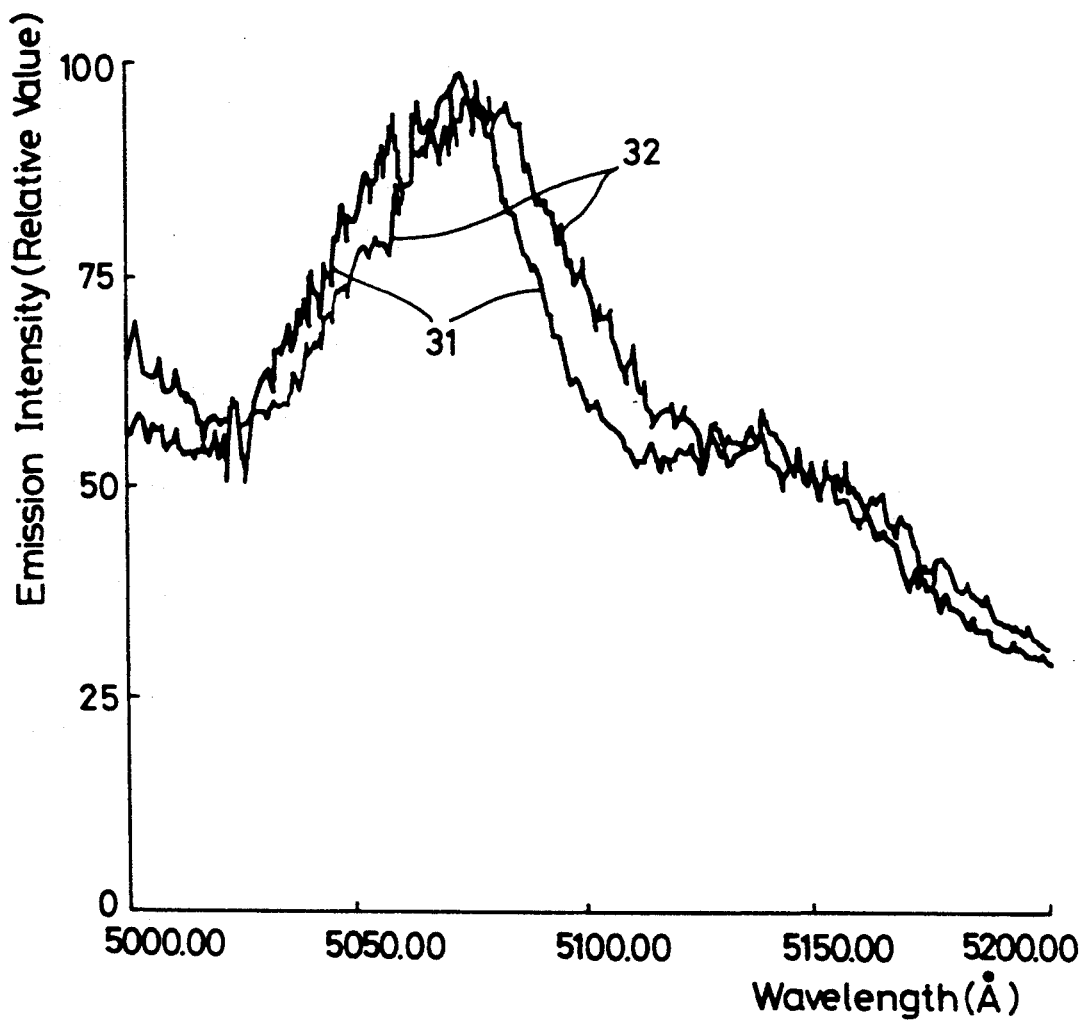
FIG. 4 shows DA emission spectral distributions of the p-type CdS of FIG. 2 before and after the intensity of the excitation light is changed.

FIG. 4 shows an emission spectral distributions of the p-type CdS of the CdS of this embodiment before and after the intensity of the excitation light is changed. Referring to FIG. 4, a curve 31 and a curve 32 show emission spectral distributions when the ratio of the intensities of the excitation lights changed is selected to be 1:½ . It will be understood from FIG. 4 that emission peaks are shifted to the short-wavelength side when the intensity of excitation light is increased, which confirms that the D-Aemission is generated.

Accordingly, a p-type CdS with desired light emission characteristics can be produced by doping oxygen to the CdS layer.

Figure 1:
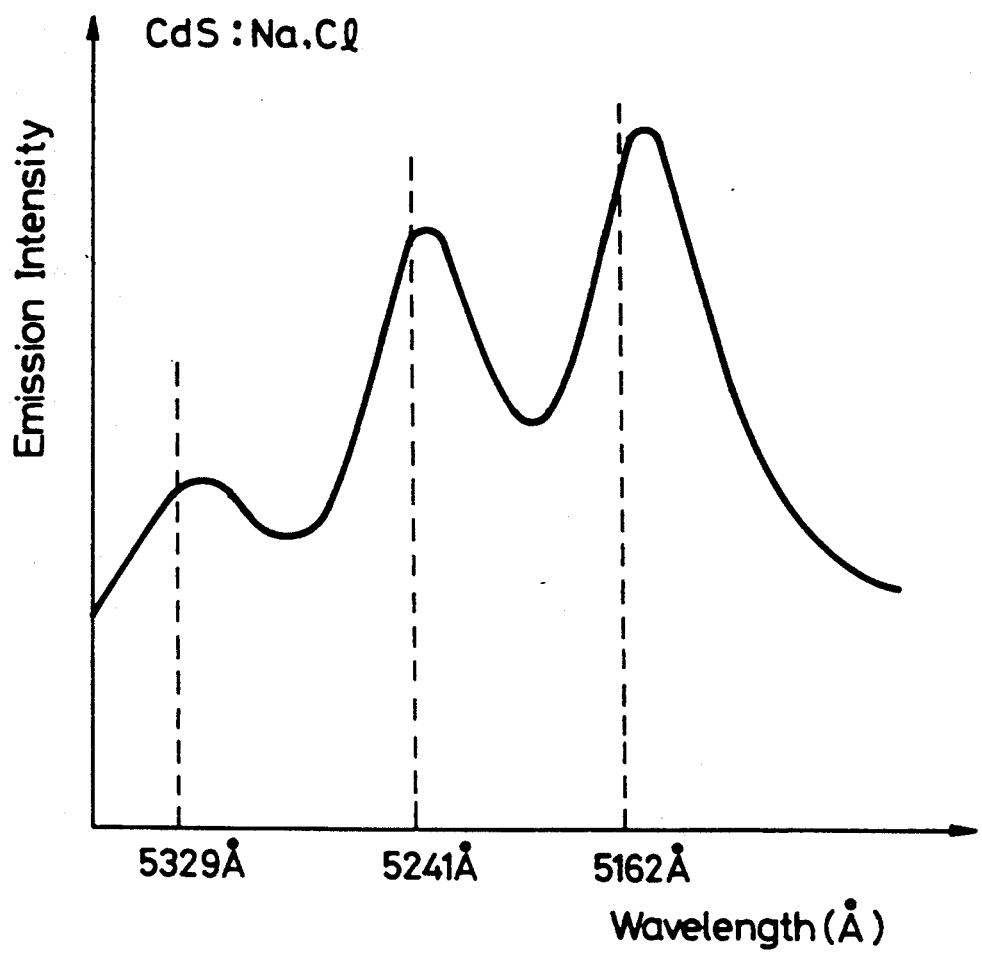
FIG. 1 shows an donor-to-acceptor (DA) emission spectral distribution of a conventional CdS.

In the oxygen-doped p-type CdS according to the embodiment, the D-A light emission energy thereof is 2.44 eV at 5070 Å . While, a zero-phonon line of the D-A light emission in the conventional Na.Cl-doped CdS is 5162 Å as shown in FIG. 1. Thus, it will be understood that, even as compared with the same, the acceptor level of the doped-oxygen is low, that is, 130 meV.

While in the above-described embodiment a p-type CdS of the present invention is applied to form a photo-luminescence element and its light emission is confirmed, the present invention may be applied to a light emitting element such as a laser diode or the like. In this case, the light emitting element can also emit the light of short wavelengths.

Further, while, in the above-described embodiment, the CdS layer is formed by the MBE technique and then oxygen is doped in the CdS layer by the ion implantation technique, it will be apparent by those skilled in the art that the oxygen-doped CdS may be formed by various other methods. For example, the oxygen-doped CdS may be formed by the epitaxial growth process by utilizing the chemical vapor deposition process including oxygen compound.

As set out above, according to the oxygen doped p-type CdS of the present invention, since the generation of vacancy can be suppressed in the producing process thereof despite that it is a p-type CdS, so that it is possible to produce a p-type CdS which is high in the degree of crystallization and in reliability and so good in yield.

Further, since the acceptor level of the p-type CdS produced according to the invention is low, the light emitting element, which can emit light of short wavelengths, can be formed by using the same. Further, the activation ratio thereof is high and the crystallization degree thereof is ligh so that a light emitting element high in luminous can be obtained.

Having described the preferred embodiment of the invention with reference to the accompanying drawings, it is to be understood that the invention is not limited to that precise embodiment and that various changes and modifications thereof could be effected by one skilled in the art without departing from the spirit or scope of the novel concepts of the invention as defined in the appended claims.

What is claimed is:

1. A method of producing a p-type CdS, comprising the step of doping oxygen into a CdS at a concentration between $10^{16}$ and $10^{19}$ atomic/cm$^3$.

2. A method of producing a p-type CdS according to claim 1, further comprising the step of annealing said CdS after being doped with oxygen.

3. A method of producing a p-type CdS as claimed in claim 1, wherein said CdS is formed on a GaAs single crystalline by an expitarial growth method.

4. A method of producing a p-type CdS as claimed in claim 3, wherein said CdS is made as a layer having a thickness of 2 μm.

5. A method of producing a p-type CdS as claimed in claim 4, wherein oxygen is doped into said CdS layer by a depth of 1.2 μm from its surface.

6. A method of producing a p-type CdS as claimed in claim 1, wherein said doping of oxygen is carried out by an ion-implantation process.

7. A method of producing a p-type CdS as claimed in claim 2, wherein said annealing is carried out at a temperature of 419°C.

* * * * *